United States Patent
Li et al.

(10) Patent No.: US 11,787,660 B2
(45) Date of Patent: Oct. 17, 2023

(54) BRAKE MONITORING CIRCUITRY, ELEVATOR SYSTEM AND BRAKE MONITORING METHOD

(71) Applicant: Otis Elevator Company, Farmington, CT (US)

(72) Inventors: Bichun Li, Shanghai (CN); Shenhong Wang, Shanghai (CN)

(73) Assignee: OTIS ELEVATOR COMPANY, Farmington, CT (US)

(*) Notice: Subject to any disclaimer, the term of this patent is extended or adjusted under 35 U.S.C. 154(b) by 0 days.

(21) Appl. No.: 17/537,587

(22) Filed: Nov. 30, 2021

(65) Prior Publication Data
US 2022/0380174 A1    Dec. 1, 2022

(30) Foreign Application Priority Data
May 28, 2021   (CN) .......................... 202110591473.3

(51) Int. Cl.
G01R 19/14    (2006.01)
B66B 5/00     (2006.01)

(52) U.S. Cl.
CPC ............ B66B 5/0025 (2013.01); G01R 19/14 (2013.01)

(58) Field of Classification Search
CPC ...... B66B 5/0025; B66B 5/0037; G01R 19/01
USPC ........................................................ 324/133
See application file for complete search history.

(56) References Cited

U.S. PATENT DOCUMENTS

| | | | |
|---|---|---|---|
| 3,134,061 A | | 5/1964 | Nederbragt et al. |
| 3,895,692 A | * | 7/1975 | Yeasting .................... B66B 1/20 187/382 |
| 8,869,945 B2 | | 10/2014 | Härkönen et al. |
| 9,441,692 B2 | * | 9/2016 | Schaefer ................ F16D 66/025 |
| 10,214,383 B2 | | 2/2019 | Sonnenmoser et al. |
| 2004/0216960 A1 | * | 11/2004 | Kocher ................ B66B 11/0407 187/289 |
| 2009/0120725 A1 | * | 5/2009 | Syrman .................. B66B 5/0031 187/276 |
| 2013/0306414 A1 | * | 11/2013 | Rahunen ................... B66D 5/02 188/74 |
| 2017/0001832 A1 | * | 1/2017 | Lindberg ................... B66B 1/34 |
| 2021/0155449 A1 | * | 5/2021 | Wenlin .................. B66B 5/0031 |

FOREIGN PATENT DOCUMENTS

| | | |
|---|---|---|
| CN | 202245602 U | 5/2012 |
| CN | 202296644 U | 7/2012 |
| CN | 203529643 U | 4/2014 |
| CN | 104058309 A | 9/2014 |
| CN | 104291197 A | 1/2015 |
| CN | 204096806 U | 1/2015 |
| CN | 104555626 A | 4/2015 |

(Continued)

*Primary Examiner* — Christopher P McAndrew
(74) *Attorney, Agent, or Firm* — CANTOR COLBURN LLP

(57) ABSTRACT

A holding brake monitoring circuit system, an elevator system, and a holding brake monitoring method. The holding brake monitoring circuit system includes a plurality of opening sensors corresponding to holding brakes, wherein the number of the opening sensors is an even number greater than 3, and the opening sensors are configured to be paired to form at least two working groups, and each of the working groups is configured to output an output signal for judging status of the holding brake(s).

17 Claims, 7 Drawing Sheets

(56) References Cited

FOREIGN PATENT DOCUMENTS

| | | | |
|---|---|---|---|
| CN | 105236232 A | 1/2016 | |
| CN | 205652937 U | 10/2016 | |
| CN | 106586737 A | 4/2017 | |
| CN | 106882662 A | 6/2017 | |
| CN | 207390701 U | 5/2018 | |
| CN | 108439117 A | 8/2018 | |
| CN | 209543739 U | 10/2019 | |
| CN | 111532920 A | 8/2020 | |
| CN | 111807182 A | 10/2020 | |
| JP | H04101976 A | 4/1992 | |
| JP | 2015006945 A * | 1/2015 | |
| WO | WO-0007256 A1 * | 2/2000 | ......... G01R 31/3631 |
| WO | WO-2011146076 A1 * | 11/2011 | ............... B66D 5/14 |

* cited by examiner

BRAKE MONITORING CIRCUITRY, ELEVATOR SYSTEM AND BRAKE MONITORING METHOD

FOREIGN PRIORITY

This application claims priority to Chinese Patent Application No. 202110591473.3 filed May 28, 2021, and all the benefits accruing therefrom under 35 U.S.C. § 119, the contents of which in its entirety are herein incorporated by reference.

TECHNICAL FIELD

The present application relates to the field of elevators, and specifically to a holding brake monitoring circuit system, an elevator system, and a holding brake monitoring method.

BACKGROUND

In the elevator field, the holding brake monitoring circuit system is an effective method to monitor whether the holding brake of the elevator works normally. The existing monitoring circuit collects the opening and closing status of each micro switch corresponding to the holding brake, and judges whether each holding brake is working normally based on this, and then judges whether the holding brake system comprising multiple holding brakes is working normally.

However, this method usually needs to scan the output signal of each micro switch, which is sometimes inefficient. In addition, since the output of each micro switch is introduced into the judgment circuit, this will also occupy a large number of ports of the judgment circuit. In some cases, the number of ports may limit the number of micro switches that can be configured.

SUMMARY

In order to at least solve the inefficiency problem of the need to scan the output signal of each micro switch, embodiments of the present application provide a holding brake monitoring circuit system, an elevator system, and a holding brake monitoring method, which can monitor working status of the holding brake of the elevator in a group manner to improve the efficiency of monitoring.

According to an aspect of the present application, there is provided a holding brake monitoring circuit system comprising: a plurality of opening sensors corresponding to holding brakes, wherein the number of the opening sensors is an even number greater than 3, and the opening sensors are configured to be paired to form at least two working groups, and each of the working groups is configured to output an output signal for judging status of the holding brake(s).

In some embodiments of the present application, optionally, if the number of the holding brake is an odd number, one of the holding brakes is configured to be coupled to two of the opening sensors which are paired into a working group, and each of the remaining holding brakes is configured to be coupled to respective one of the opening sensors.

In some embodiments of the present application, optionally, if the number of the holding brakes is an even number, each of the holding brakes is configured to be coupled to respective one of the opening sensors.

In some embodiments of the present application, optionally, each of the opening sensors has a basic polarity, a normally closed polarity, and an operation polarity; for each of the opening sensors being not in operation, its basic polarity is turned on and its normally closed polarity or operation polarity is turned on; and for each of the opening sensors being in normal operation, its basic polarity is turned on and its operation polarity or normally closed polarity is turned on.

In some embodiments of the present application, optionally, each of the working groups is connected in series.

In some embodiments of the present application, optionally, the basic polarities of the two opening sensors in each of the working group are connected; when being connected in series, the normally closed polarity of the first opening sensor of the first working group is connected to the high potential, and the operation polarity of the second opening sensor is also connected to the high potential, the normally closed polarity of the second opening sensor is for the next working group to be connected; and the first part of the output signal is generated based on the operation polarity of the first opening sensor of the first working group.

In some embodiments of the present application, optionally, in the serial connection, except for the first working group, the normally closed polarity of the first opening sensor of each of the working groups is connected to the previous working group, and the operation polarity of the second opening sensor is connected to the high potential; and the second part of the output signal is generated based on the operation polarity of the first opening sensor of each of the working groups.

In some embodiments of the present application, optionally, the third part of the output signal is generated based on the normally closed polarity of the second opening sensor of the last working group in the serial connection.

In some embodiments of the present application, optionally, further comprising a logical AND gate configured to receive the first part and the second part of the output signal and output the fourth part of the output signal.

In some embodiments of the present application, optionally, the holding brake monitoring circuit system further comprises a power supply device configured to provide the high potential.

In some embodiments of the present application, optionally, the opening sensors are micro switches.

In some embodiments of the present application, optionally, the holding brake monitoring circuit system further comprises a judgment circuit configured to determine status of the holding brakes according to the output signal.

According to another aspect of the present application, there is provided an elevator system comprising any one of the holding brake monitoring circuit systems described above.

According to another aspect of the present application, there is provided a holding brake monitoring method comprising: pairing a plurality of opening sensors corresponding to holding brakes to form at least two working groups, wherein the number of the opening sensors is an even number greater than 3; and forming an output signal for judging status of the holding brakes according to each of the working groups.

In some embodiments of the present application, optionally, the step of pairing the opening sensors comprises: if the number of the holding brakes is an odd number, one of the holding brakes is configured to be coupled to two of the opening sensors which are paired into a working group, and each of the remaining holding brakes is configured to be coupled to respective one of the opening sensors.

In some embodiments of the present application, optionally, the step of pairing the opening sensors comprises: if the number of the holding brakes is an even number, each of the holding brakes is configured to be coupled to respective one of the opening sensors.

The holding brake monitoring circuit system and the elevator system comprising the holding brake monitoring circuit system according to some aspects of the present application can monitor working status of the holding brake of the elevator in a group manner, thereby overcoming the inefficiency problem of the need to scan the output signal of each micro switch. In addition, the requirements for the number of ports of the processing circuit board can also be reduced.

DESCRIPTION OF THE DRAWINGS

From the following detailed description in conjunction with the accompanying drawings, the above and other objectives and advantages of the present application will be more complete and clear, wherein the same or similar elements are represented by the same reference numerals. The figure shows the groups described in detail below in the form of a dashed frame. This division is logical and embodied in the circuit connection structure. The physical characteristics such as the position of the opening sensor comprised in the groups are not affected by this division.

DETAILED DESCRIPTION

For brevity and illustrative purposes, the present application mainly refers to its exemplary embodiments to describe the principles of the present application. However, those skilled in the art will easily recognize that the same principle can be equally applied to all types of holding brake monitoring circuit systems, elevator systems, and holding brake monitoring methods, and these same or similar principles can be implemented therein, any such changes do not depart from the true spirit and scope of the present application.

In some examples of the present application, generating an output signal based on a polarity means generating an output signal based on a level characteristic of the polarity. And the output signal may comprise multiple sources, which are described as various parts of the output signal in the present application. In some examples of the present application, the monitoring result of the holding brake monitoring circuit system may be output according to the output signal or part thereof.

Figure 1:
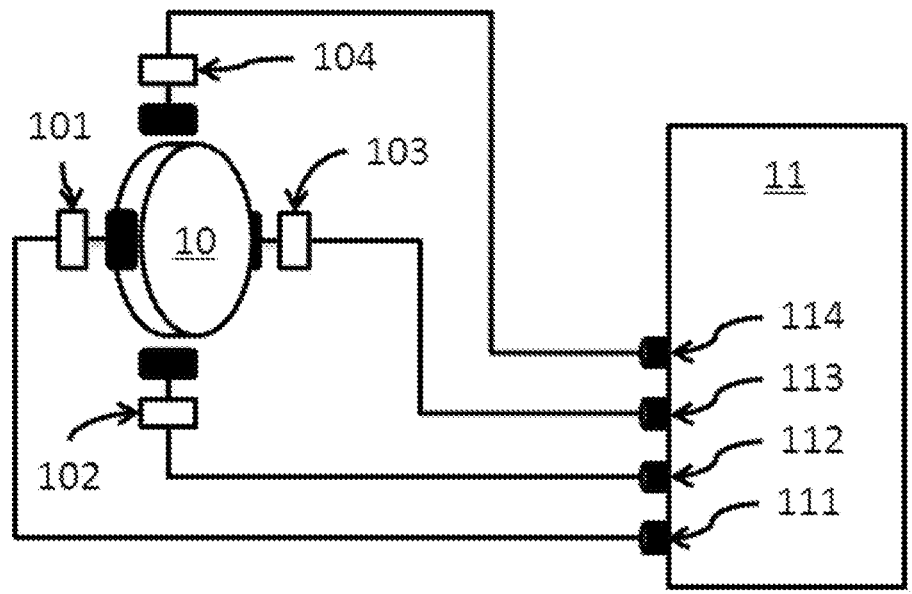
FIG. 1 shows the working principle of a holding brake monitoring circuit system according to the prior art.

FIG. 1 shows the principle of a holding brake monitoring circuit system according to the prior art. As shown in the figure, a holding brake system 10 comprises four holding brakes, and each of the holding brakes is coupled to a micro switch. The micro switches 101-104 can be respectively used to detect whether the corresponding brake is operating. Although four micro switches are shown in the figure, there may be more than four or less than four in the actual situation. For example, if the brake corresponding to the micro switch 102 is in a slack status, the micro switch 102 (two poles therein) is in an open status, and at the same time in a low level outward; if the brake corresponding to the micro switch 102 works, the micro switch 102 (two poles therein) is in a closed status, and at the same time in a high level outward. The output signals of the micro switches 101-104 are input to the four input ports 111-114 of a judgment circuit 11, respectively. The judgment circuit 11 can judge the opening and closing status of each of the micro switches 101-104 according to the signals received by the four input ports, and judge whether each holding brake is working normally based on this, and then judge whether the holding brake system 10 is working normally.

In the case that the holding brake system 10 does not work normally (for example, there is a holding brake that fails to operate in the holding brake system 10), the judgment circuit 11 can issue an instruction to the elevator, and the elevator can, for example, stop at a closer floor and suspend operation according to the instruction. In addition, the information that the holding brake system 10 does not work normally can be sent to a maintenance unit through a communication network, so as to remind the maintenance unit to check and repair as soon as possible.

However, in the manner as shown in FIG. 1, since each micro switch corresponds to a holding brake, the judgment circuit 11 needs to scan the output signal of each micro switch to judge the working status of the holding brake system 10. This method is sometimes inefficient, because even if a holding brake works abnormally, it needs to be repaired immediately. Under normal circumstances, the maintenance personnel do not need to know which holding brake is abnormal before arriving at the scene. In addition, since the output of each micro switch is introduced into the judgment circuit 11, this will also occupy a large number of ports of the judgment circuit 11, especially when there are a large number of holding brakes. Therefore, chips with a larger number of ports may be needed to implement the function of the judgment circuit 11, thus the cost will also increase.

According to an aspect of the present application, a holding brake monitoring circuit system is provided, and the holding brake monitoring circuit system comprises an opening sensor corresponding to the holding brake. The opening sensor in the context of the present application refers to a sensor that can detect the opening status of the holding brake, and it can judge whether the holding brake is operating according to the detection situation. For example, when the holding brake is in a slack status, its opening is larger; when the holding brake is operating, its opening is smaller. The opening sensor in some examples of the present application does not detect the specific value of the opening, and it can judge whether the holding brake is in an operating status according to a set threshold (for example, by configuring different gaps). In some examples, the opening sensor in some examples of the present application may be implemented with a micro switch or the like.

In the holding brake monitoring circuit system, the number of opening sensors is usually set to an even number and greater than 3. Therefore, for the case of less than 3, there is no need to address in a group manner described below. These even number of opening sensors are configured to pair two as a group, and generate output signals for judging the status of the holding brake in units of groups. These paired groups are also referred to as "working groups" in the context of the present application. The output signal can be sent to, for example, the judgment circuit 11 in FIG. 1, and the judgment circuit 11 specifically judges the status of the holding brake. In this example, the judgment circuit 11 may not necessarily judge the status of each holding brake, but judge the status of the holding brake group, and thereby infer the status of the holding brake system. In addition, in the case that the number of opening sensors (holding brakes) is large, this grouping method can significantly reduce the port occupation of the judgment circuit 11, for example, to about one-half of the original required number of ports.

Figure 2:
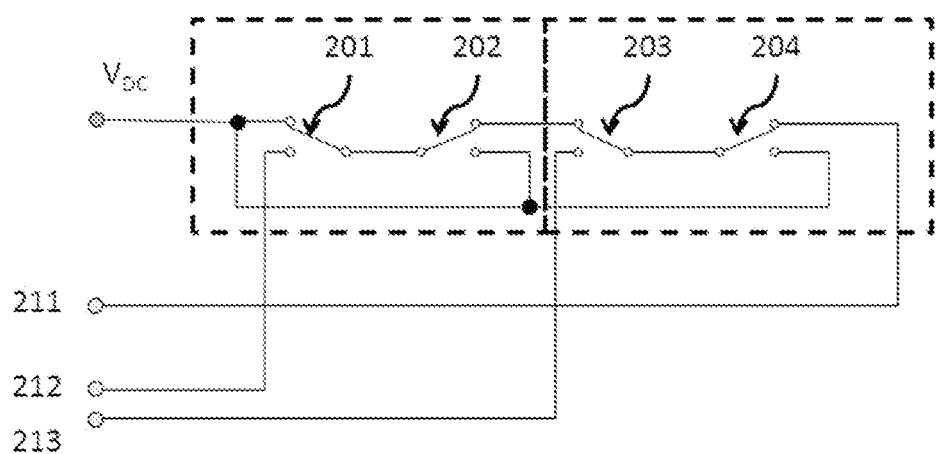
FIG. 2 schematically shows a holding brake monitoring circuit system according to an embodiment of the present application.
Figure 3:
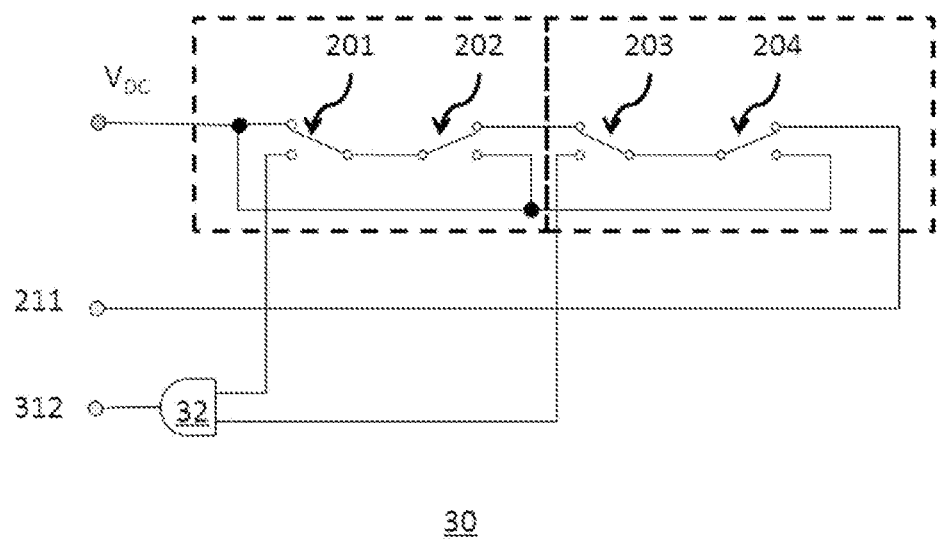
FIG. 3 schematically shows a holding brake monitoring circuit system according to another embodiment of the present application.

As shown in FIGS. 2 and 3, there are four opening sensors in the holding brake monitoring circuit system 20 and the holding brake monitoring circuit system 30. The opening sensor 201 is paired with the opening sensor 202, and the opening sensor 203 is paired with the opening sensor 204, thereby forming two groups of pairs. In FIG. 2, the output signal 212 and the output signal 213 of the holding brake monitoring circuit system 20 respectively correspond to the above-mentioned two groups of pairs, so that the output signal can be generated in units of groups. For example, the "single-pole double-throw" characteristics of the paired opening sensor can be used to pair two opening sensors, so that only when both of them are switched to the same status at the same time, it means that holding brakes corresponding to both of them are working normally, or the groups that both of them belong to are working normally.

The connection mode of the opening sensor 201 and the opening sensor 202 in FIGS. 2 and 3 shows a circuit connection diagram that uses the "single-pole double-throw" characteristics of the two, and the operating status of the opening sensor of this group and its corresponding holding brake can be judged from the output signal 212. The other groups can be connected according to the connection mode of the opening sensor 201 and the opening sensor 202. In addition, the difference between the examples corresponding to FIG. 2 and FIG. 3 will be described below.

Figure 7:
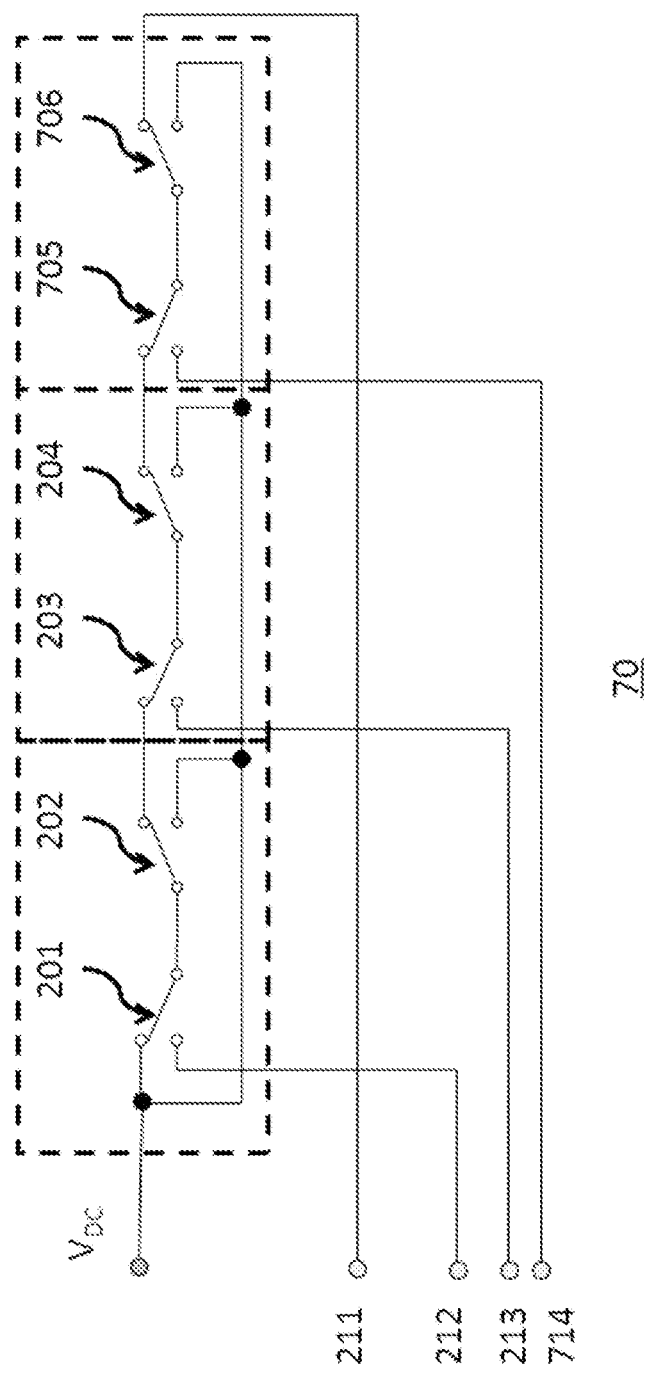
FIG. 7 schematically shows a holding brake monitoring circuit system according to another embodiment of the present application.
Figure 8:
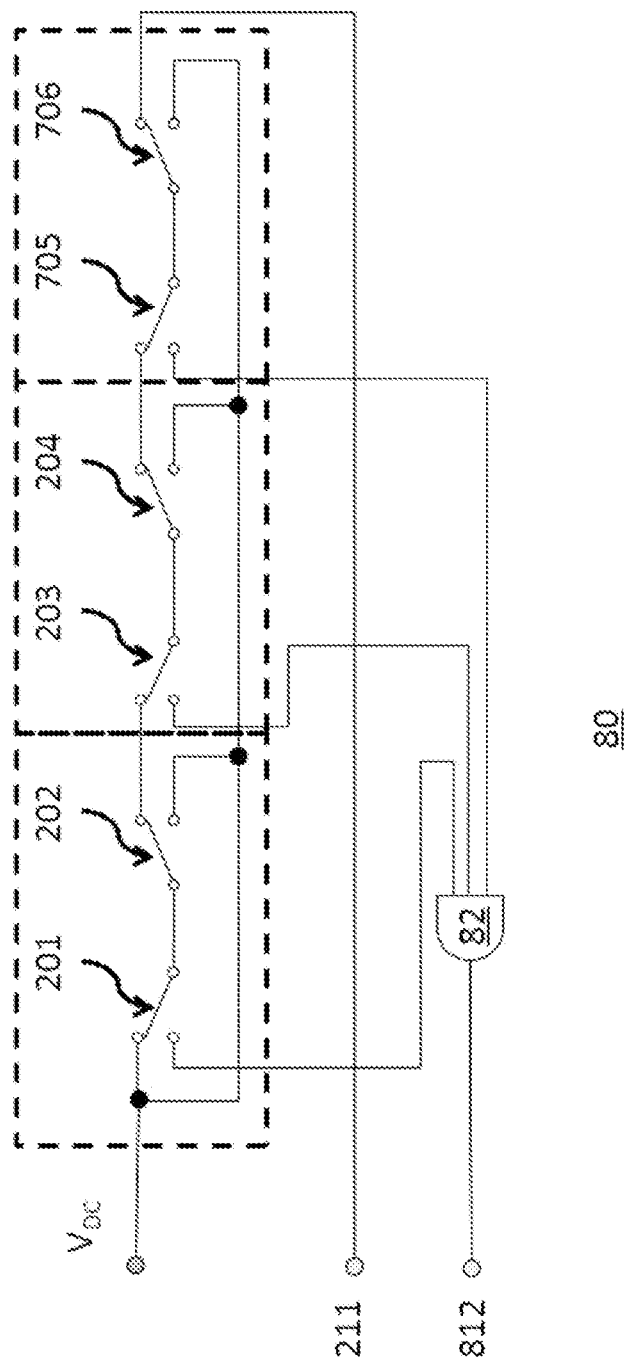
FIG. 8 schematically shows a holding brake monitoring circuit system according to another embodiment of the present application.

In the example of FIGS. 7 and 8, there are 6 opening sensors in the holding brake monitoring circuit system 70 and the holding brake monitoring circuit system 80. The opening sensor 201 is paired with the opening sensor 202, the opening sensor 203 is paired with the opening sensor 204, and the opening sensor 705 is paired with the opening sensor 706, thereby forming a total of three groups of pairs In FIG. 7, the output signal 212, the output signal 213, and the output signal 714 of the holding brake monitoring circuit system 70 respectively correspond to the above-mentioned three groups of pairs, so that the output signal can be generated in units of groups. For example, the "single-pole double-throw" characteristics of the paired opening sensor can be used to pair two opening sensors, so that only when both of them are switched to the same status at the same time, it means that holding brakes corresponding to both of them are working normally, or the groups that both of them belong to are working normally.

In the examples of FIGS. 7 and 8, the connection mode of the opening sensor 201 and the opening sensor 202 shows a circuit connection diagram that uses the "single-pole double-throw" characteristics of the two, and the operating status of the opening sensor of this group and its corresponding holding brake can be judged from the output signal 212. The other groups (the pair of the opening sensor 203 and the opening sensor 204, and the pair of the opening sensor 705 and the opening sensor 706) can be connected according to the connection mode of the opening sensor 201 and the opening sensor 202. In addition, the difference between the examples corresponding to FIG. 7 and FIG. 8 will be described below.

In some embodiments of the present application, if the number of holding brakes is an even number, the number of opening sensors may be equal to the number of holding brakes, and each holding brake is assigned a corresponding opening sensor. In some embodiments of the present application, the number of opening sensors may not be equal to the number of holding brakes. For example, if the number of holding brakes is an odd number, one of the holding brakes can be configured to be coupled to two (corresponding) opening sensors, and each of the remaining holding brakes can be configured to be coupled to a (corresponding) opening sensor.

Figure 4:
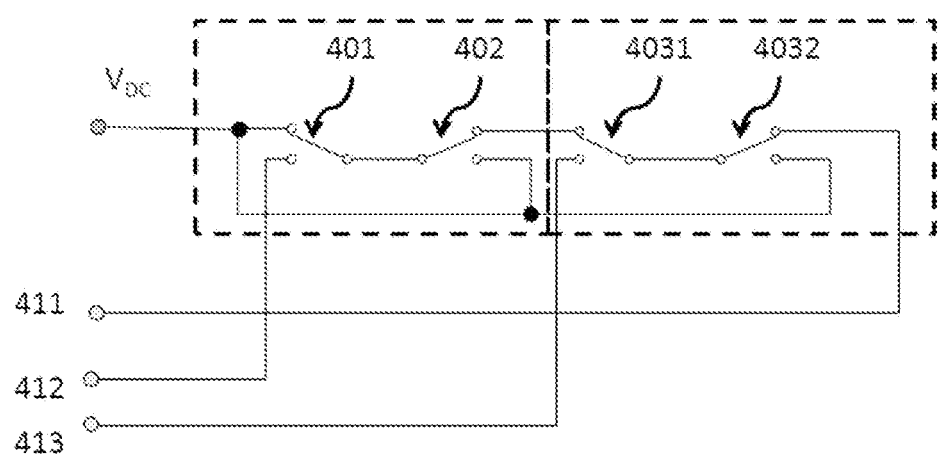
FIG. 4 schematically shows a holding brake monitoring circuit system according to another embodiment of the present application.
Figure 5:
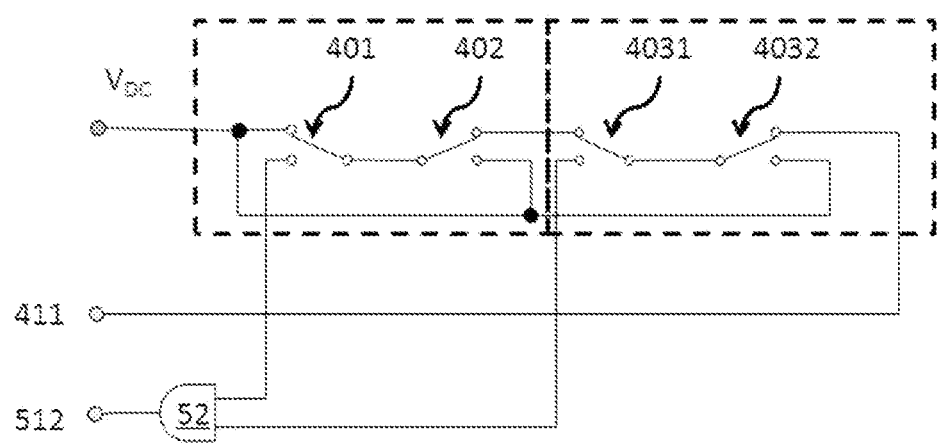
FIG. 5 schematically shows a holding brake monitoring circuit system according to another embodiment of the present application.

As shown in FIGS. 4 and 5, there are 4 opening sensors in the holding brake monitoring circuit system 40 and the holding brake monitoring circuit system 50, and the 4 opening sensors are configured to be coupled to the 3 holding brakes (not shown). The opening sensor 401 and the opening sensor 402 respectively correspond to a holding brake. The opening sensor 4031 and the opening sensor 4032 jointly correspond to a holding brake. Configured in this way, even if the number of the holding brake is an odd number, the opening sensor can also be an even number, so that the pair of opening sensors can be grouped in pairs.

In some embodiments of the present application, although not necessary, the opening sensors of the holding brake monitoring circuit system 40 in FIG. 4 and the holding brake monitoring circuit system 50 in FIG. 5 can be paired as follows: the opening sensor 401 is paired with the opening sensor 402, and the opening sensor 4031 is paired with the opening sensor 4032, thereby forming two groups of pairs. The output signal 412 and the output signal 413 of the holding brake monitoring circuit system 40 respectively correspond to the above-mentioned two groups of pairs, so that the output signal can be generated in units of groups.

Figure 6:
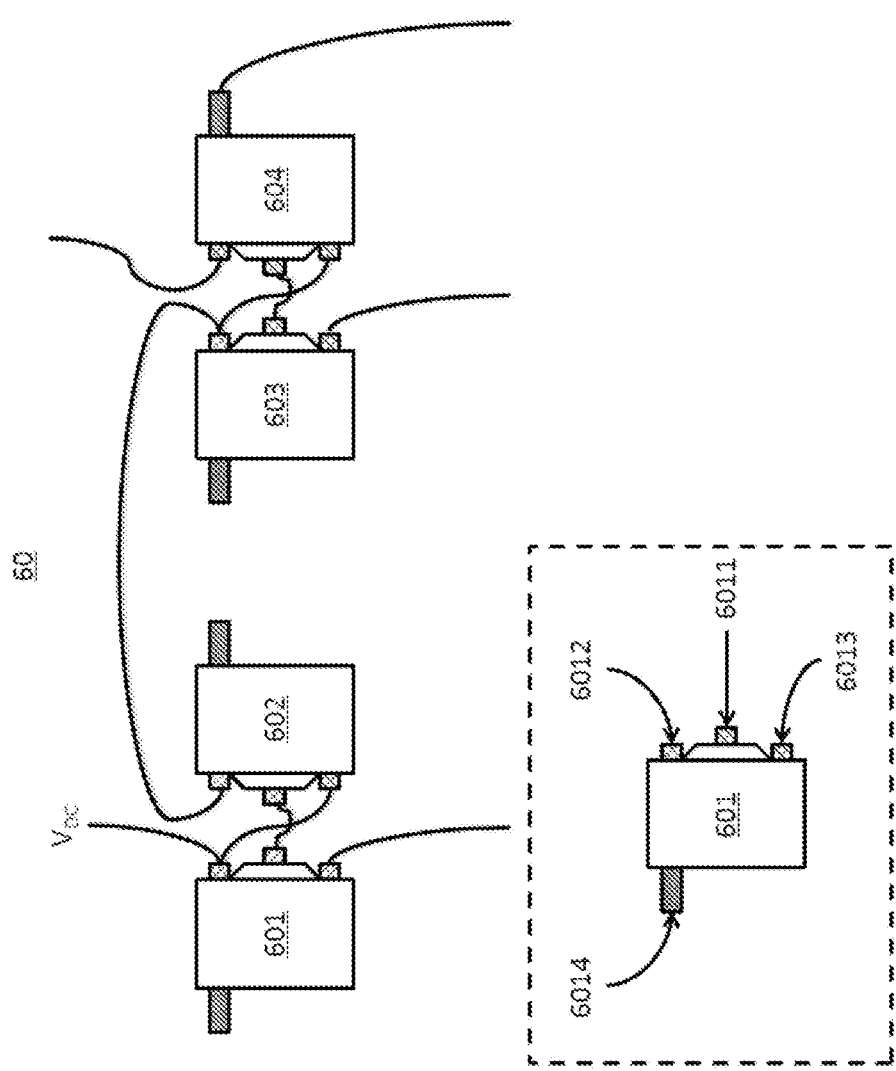
FIG. 6 schematically shows a holding brake monitoring circuit system according to another embodiment of the present application.

In some embodiments of the present application, the opening sensor specifically comprises three polarities (also referred to as "connection contacts"), i.e., basic polarity, normally closed polarity and operation polarity. FIG. 6 shows an opening sensor 601 according to some examples of the present application. The opening sensor 601 has a head 6014 for sensing gap changes (caused by pressure or tension, etc.), and a basic polarity 6011, normally closed polarity 6012 and operation polarity 6013. The other opening sensors in the figure have the same structure as the opening sensor 601.

In some examples, when the holding brake corresponding to the opening sensor 601 is not operating, the basic polarity 6011 and the normally closed polarity 6012 of the opening sensor 601 are turned on; and when the corresponding holding brake is operating normally, the basic polarity 6011 and the operation polarity 6013 of the opening sensor 601 are turned on.

In other examples, each opening sensor may also be configured in another manner. For example, when the holding brake corresponding to the opening sensor 601 is not operating, the basic polarity 6011 and the operation polarity 6013 of the opening sensor 601 are turned on; and when the corresponding holding brake is operating normally, the basic polarity 6011 and the normally closed polarity 6012 of the opening sensor 601 are turned on.

The opening sensor 601 shown in FIG. 6 may be used in corresponding examples such as FIGS. 2-5, 7 and 8. For example, in some examples, the opening sensors shown in FIG. 6 and FIG. 2 etc. have the same configurations, and the connection mode of the opening sensor 601-604 in FIG. 6 is the physical display of the connection mode of the opening sensor 201-204 in FIG. 2, and both have the same technical meaning. For the connection mode of each opening sensor in FIG. 6 and the principle behind it, reference may be made to the description of the corresponding example in FIG. 2.

In some embodiments of the present application, as shown in FIGS. 2-8, the paired groups (each of the working groups) are connected in series, so that the characteristics of the series circuit can be used to obtain the output signal. For example, the conduction of the series circuit can be guaranteed only when each node of the series circuit is turned on. In addition, the basic polarities of the two opening sensors in each group of pairs are connected. Continuing to refer to FIG. 2, in the serial connection, the normally closed polarity of the first opening sensor (opening sensor 201) in the first group of pairs (the first working group composed of the opening sensor 201 and the opening sensor 202) is connected to the high potential $V_{DC}$, and the operation polarity of the second opening sensor (opening sensor 202) is also connected to the high potential $V_{DC}$, and the normally closed polarity of the second opening sensor is provided to the next group (composed of the opening sensor 203 and the opening sensor 204). In addition, as a part of the output signal, the output signal 212 may also be generated based on the operation polarity of the first opening sensor of the first group.

In some embodiments of the present application, continuing to refer to FIG. 2, in a serial connection, except for the first group of pairs, the normally closed polarity of the first opening sensor in each paired group is connected to the previous group. For example, the normally closed polarity of the first opening sensor (opening sensor 203) in the second group of pairs (composed of the opening sensor 203 and the opening sensor 204) is connected to the normally closed polarity of the second opening sensor in the first group of pairs. On the other hand, similar to the first group, the operation polarity of the second opening sensor (opening sensor 204) in the second group of pairs is connected to the high potential $V_{DC}$. In addition, as a part of the output signal, an output signal may be generated based on the operation polarity of the first opening sensor of each group. For example, it is illustrated that the output signal 213 is generated based on the operation polarity of the first opening sensor of the second group.

In the example of FIG. 7, in addition to the first group of pairs in the serial connection, the normally closed polarity of the first opening sensor in each paired group is connected to the previous group. Wherein, the normally closed polarity of the first opening sensor (opening sensor 203) in the second group of pairs (composed of the opening sensor 203 and the opening sensor 204) is connected to the normally closed polarity of the second opening sensor in the first group of pairs. On the other hand, similar to the first group, the operation polarity of the second opening sensor (opening sensor 204) in the second group of pairs is connected to the high potential $V_{DC}$. In addition, as a part of the output signal, an output signal may be generated based on the operation polarity of the first opening sensor of each group. For example, it is illustrated that the output signal 213 is generated based on the operation polarity of the first opening sensor of the second group.

In addition, continuing to refer to FIG. 7, the normally closed polarity of the first opening sensor (opening sensor 705) in the third group of pairs (composed of the opening sensor 705 and the opening sensor 706) is connected to the normally closed polarity of the second opening sensor in the second group of pairs. On the other hand, similar to the first and second groups, the operation polarity of the second opening sensor (opening sensor 706) in the second group of pairs is connected to the high potential $V_{DC}$. In addition, as a part of the output signal, it is illustrated that the output signal 714 is generated based on the operation polarity of the first opening sensor of the third group.

In some embodiments of the present application, the third part of the output signal is also generated based on the normally closed polarity of the second opening sensor of the last group of pairs (last working group) in the serial connection. Continuing to refer to FIG. 2, the second group is also the last group of pairs. Therefore, as a part of the output signal, the output signal 211 may also be generated based on the operation polarity of the second opening sensor of this group of pairs. In the example of FIG. 7, the third group is the last group of pairs. As a part of the output signal, the output signal 211 may also be generated based on the operation polarity of the second opening sensor of this group of pairs.

Taking FIG. 2 as an example to illustrate the principles of some examples of the present application. Assuming the normal working status of the opening sensor, when the holding brake corresponding to the opening sensor 201 is not operating, the basic polarity and the normally closed polarity of the opening sensor 201 are turned on (as shown in the figure), and when the corresponding holding brake is operating normally, the basic polarity and the operation polarity of the opening sensor 201 are turned on (the switch shown by the opening sensor 201 is set to the bottom). Other opening sensors can also imitate this design.

When each of the holding brakes corresponding to the holding brake monitoring circuit system 20 is in an inactive standby status, the opening sensors 201-204 should be in the positions shown in the figure, and the output signal 211 should be the same as the $V_{DC}$ at this time. Therefore, the output signal 211 can be used to judge whether each of the holding brakes corresponding to the holding brake monitoring circuit system 20 is in a standby status when not operating, that is, each of the holding brakes should be slack. If there is any holding brake that is operating and tensioning, the output signal 211 will not show a level equal to $V_{DC}$. It can be seen from this setting that the output signal 211 can be used to judge whether the initial status of the holding brake monitoring circuit system 20 is normal. The output signal 411 in FIG. 4 and FIG. 5, and the output signal 211 in FIG. 7 and FIG. 8 also have the same function, which will not be repeated here.

When each of the holding brakes corresponding to the holding brake monitoring circuit system 20 is operating, the opening sensors 201-204 should be dialed down to the other polarity. At this time, the output signal 211 should undergo a lower jump (for example, embodied as a falling edge), and the output signals 212 and 213 should undergo a higher jump (for example, embodied as a rising edge) and become equal to VDC. At this time, if any one of the first group of pairs fails to be dialed down to the other polarity (generally due to the failure of its corresponding holding brake), the output signal 212 cannot undergo the above-mentioned jump. The judgment circuit may determine, according to the output signal 212, that the holding brake corresponding to the group of pairs may have a fault, and may further send an instruction to stop service to the elevator control system. On the other hand, if any one of the second group of pairs fails to be dialed down to the other polarity, the output signal 213 cannot undergo the above-mentioned jump and cannot become equal to $V_{DC}$.

Taking FIG. 7 as an example to illustrate the working principles of some examples of the present application. Similar to the example corresponding to FIG. 2, assuming the normal working status of the opening sensor: for example, when the holding brake corresponding to the opening sensor 705 is not operating, the basic polarity and the normally closed polarity of the opening sensor 705 are turned on (as shown in the figure), and when the corresponding holding brake is operating normally, the basic polarity and the operation polarity of the opening sensor 705 are turned on (the switch shown by the opening sensor 705 is set to the bottom). Other opening sensors can also imitate this design.

When each of the holding brakes corresponding to the holding brake monitoring circuit system 70 is in an inactive standby status, the opening sensors 201-204, 705 and 706 should be in the positions shown in the figure, and the output signal 211 should be the same as the $V_{DC}$ at this time. Therefore, the output signal 211 can be used to judge whether each of the holding brakes corresponding to the holding brake monitoring circuit system 70 is in a standby status when not operating, that is, each of the holding brakes should be slack. If there is any holding brake that is operating and tensioning, the output signal 211 will not show a level equal to $V_{DC}$. It can be seen from this setting that the output signal 211 can be used to judge whether the initial status of the holding brake monitoring circuit system 70 is normal.

When each of the holding brakes corresponding to the holding brake monitoring circuit system 70 is operating, the opening sensors 201-204, 705 and 706 should be dialed down to the other polarity. At this time, the output signal 211 should undergo a lower jump (for example, embodied as a falling edge), and the output signals 212, 213 and 714 should undergo a higher jump (for example, embodied as a rising edge) and become equal to VDC. At this time, if any one of the third group of pairs fails to be dialed down to the other polarity (generally due to the failure of its corresponding holding brake), the output signal 714 cannot undergo the above-mentioned jump. The judgment circuit may determine, according to the output signal 714, that the holding brake corresponding to the group of pairs may have a fault, and may further send an instruction to stop service to the elevator control system. On the other hand, if any one of the other groups of pairs fails to be dialed down to the other polarity, its corresponding output signal cannot undergo the above-mentioned jump and cannot become equal to $V_{DC}$.

In some embodiments of the present application, as shown in FIGS. 3 and 5, the holding brake monitoring circuit system 30 (50) further comprises a logical AND gate 32 (52). Wherein, the input of the logic AND gate 32 comprises: the first part (analogous to the output signal 212 in FIG. 2) and the second part (analogous to the output signal 213 in FIG. 2) of the output signal, and the output of the logic AND gate 32 can be the fourth part of the output signal, for example, the output signal 312 shown in FIG. 3. The logic AND gate 52 in FIG. 5 is also configured according to the configuration of the logic AND gate 32, and the output of the holding brake monitoring circuit system 50 comprises a signal 512. In the example of FIG. 8, the holding brake monitoring circuit system 80 further comprises a logical AND gate 82. Wherein, the input of the logical AND gate 82 comprises: the output signal of the first group (analogous to the output signal 212 in FIG. 7), the output signal of the second group (analogous to the output signal 213 in FIG. 7), and the output signal of the third group (analogous to the output signal 714 in FIG. 7), and the output of the logical AND gate 32 can be the fourth part of the output signal, for example, the output signal 812 shown in FIG.8.

Continuing the above example, after introducing the logic AND gate 32 in FIG. 3, if any one of the corresponding output signal 212 or the output signal 213 in FIG. 2 fails to undergo the above-mentioned jump, it becomes equal to $V_{DC}$, the output signal 312 will not undergo a higher jump (for example, it becomes equal to $V_{DC}$). Similarly, after introducing the logic AND gate 82 in FIG. 8, if any one of the corresponding output signals 212, 213, and 714 in FIG. 7 fails to undergo the above-mentioned jump and cannot becomes equal to $V_{DC}$, then the output signal 812 will not undergo a higher jump (for example, it becomes equal to $V_{DC}$). The above output signals 312 and 812 can be used to judge the working status of the holding brake system. Compared with the traditional solution, the solution in the example of the present application can reduce the occupation of the processing circuit port.

The above also introduces that each opening sensor can be configured in another way. Wherein, when the holding brake corresponding to the opening sensor is not operating, the basic polarity and the operation polarity of the opening sensor are turned on, and when the corresponding holding brake is operating normally, the basic polarity and the normally closed polarity of the opening sensor are turned on.

For example, continuing to refer to the example of FIG. 2, when each of the holding brakes corresponding to the holding brake monitoring circuit system 20 is in an inactive standby status, the opening sensors 201-204 should be in the opposite position shown in the figure (dial to the lower contact in the figure). At this time, the output signals 212 and 213 should be the same as $V_{DC}$. Therefore, the output signals 212 and 213 can be used to judge whether each of the holding brakes corresponding to the holding brake monitoring circuit system 20 is in a standby status when not operating, that is, each of the holding brakes should be slack. If there is any holding brake in the first group that is operating and tensioning, the output signal 212 will not show a level equal to $V_{DC}$; if there is any holding brake in the second group that is operating and tensioning, the output signal 213 will not show a level equal to $V_{DC}$ It can be seen from this setting that the output signals 212 and 213 can be used to judge whether the initial status of the holding brake monitoring circuit system 20 is normal.

Continuing the above example, when the logic AND gate 32 is introduced in FIG. 3, if any one of the corresponding output signal 212 or the output signal 213 in FIG. 2 is not equal to $V_{DC}$, the output signal 312 will not reflected as a high level. Therefore, the output signal 312 can also be used to judge whether the initial status of the holding brake system 30 is normal.

Continuing to refer to FIG. 2, when each of the holding brakes corresponding to the holding brake monitoring circuit system 20 is operating, the opening sensors 201-204 should be switched to the position shown in the figure, at this time, the output signal 211 should undergo a higher jump (for example, embodied as a rising edge), if any opening sensor of the any group fails to be dialed down to the other polarity (generally due to the failure of its corresponding holding brake), the output signal 211 cannot undergo the above-mentioned jump. The judgment circuit may determine, according to the output signal 211, that the holding brake system may have a fault, and may further send an instruction to stop service to the elevator control system.

The basic principles described above with respect to FIG. 2 and FIG. 3 are equally applicable to the corresponding examples of FIG. 4 and FIG. 5, FIG. 7 and FIG. 8, and will not be repeated here.

According to another aspect of the present application, an elevator system is provided. The elevator system comprises any holding brake monitoring circuit system as described above. According to the above description of the holding brake monitoring circuit system, once the holding brake is found to be faulty, the elevator can be configured to stop running, for example, so as to reduce the probability of running accidents.

Figure 9:
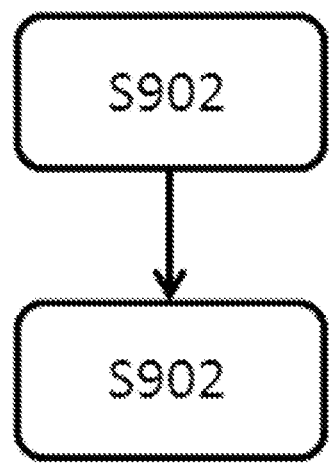
FIG. 9 schematically shows a holding brake monitoring method according to an embodiment of the present application.

According to another aspect of the present application, a holding brake monitoring method is provided. As shown in FIG. 9, the holding brake monitoring method 90 comprises the following steps. In step S902, an opening sensor corresponding to the holding brake is configured to pair two as a group to form at least two working groups, wherein the number of the opening sensor is an even number greater than 3. In step S904, an output signal for judging the status of the holding brake is formed according to each of the working groups.

The opening sensor in the context of the present application refers to a sensor that can detect the opening status of the holding brake, and it can judge whether the holding brake is operating according to the detection situation. For example, when the holding brake is in a slack status, its opening is larger; when the holding brake is operating, its opening is smaller. The opening sensor in some examples of the present application does not detect the specific value of the opening, and it can judge whether the holding brake is in an operating status according to a set threshold (for example, by configuring different gaps). In some examples, the opening sensor in some examples of the present application may be implemented with a micro switch or the like.

In the holding brake monitoring circuit system, the number of opening sensors is usually set to an even number and greater than 3. Therefore, for the case of less than 3, there is no need to address in a group manner described below. These even number of opening sensors are configured to pair two as a group, and generate output signals for judging the status of the holding brake in units of groups.

These paired groups are also referred to as "working groups" in the context of the present application. The output signal can be sent to, for example, the judgment circuit 11 in FIG. 1, and the judgment circuit 11 specifically judges the status of the holding brake. In this example, the judgment circuit 11 may not necessarily judge the status of each holding brake, but judge the status of the holding brake group, and thereby infer the status of the holding brake system. In addition, in the case that the number of opening sensors (holding brakes) is large, this grouping method can significantly reduce the port occupation of the judgment circuit 11, for example, to about one-half of the original required number of ports.

In some embodiments of the present application, the following process is specifically executed in step S902: if the number of the holding brake is an odd number, one of the holding brakes is configured to be coupled to two corresponding opening sensors and the two corresponding opening sensor is paired into a working group, and each of the remaining holding brakes is configured to be coupled to a corresponding opening sensor.

In some embodiments of the present application, the following process is specifically executed in step S902: if the number of the holding brakes is an even number, each of the holding brakes is configured to be coupled to a corresponding opening sensor.

It should be understood that the relative position terms recorded in the present application (such as "forward", "backward", "upper", "lower", "above", "below", "bottom", "top" ", etc.) refer to normal operating postures and should not be considered as being restricted in other ways. It should be understood that the same reference numbers throughout the multiple figures identify corresponding or similar elements. It should also be understood that although specific component configurations are disclosed in the illustrated embodiment, other configurations will benefit from this.

Although different non-limiting embodiments have specifically illustrated components, the embodiments of the present application are not limited to these specific combinations. It is possible to use components or some of the features from any non-limiting embodiment in combination with features or components from any other non-limiting embodiment. The above are only specific implementations of the present application, but the protection scope of the present application is not limited thereto. Those skilled in the art can think of other feasible changes or substitutions according to the technical scope disclosed in the present application, and these changes or substitutions are all covered by the protection scope of the present application. In the case of no conflict, the embodiments of the present application and the features in the embodiments can also be combined with each other. The protection scope of the present application is subject to the description of the claims.

What is claimed is:

1. A holding brake monitoring circuit system comprising:
a plurality of opening sensors corresponding to holding brakes, wherein the number of the opening sensors is an even number greater than 3, and the opening sensors are configured to be paired to form at least two working groups, each of the working groups including a pair of opening sensors, and each of the working groups is configured to output a single output signal for judging status of holding brakes corresponding to the respective working group.

2. The holding brake monitoring circuit system according to claim 1, wherein if the number of the holding brakes is an odd number, one of the holding brakes is configured to be coupled to two of the opening sensors which are paired into a working group, and each of the remaining holding brakes is configured to be coupled to respective one of the opening sensors.

3. The holding brake monitoring circuit system according to claim 1, wherein if the number of the holding brakes is an even number, each of the holding brakes is configured to be coupled to respective one of the opening sensors.

4. The holding brake monitoring circuit system according to claim 2, wherein each of the opening sensors has a basic polarity, a normally closed polarity, and an operation polarity;
for each of the opening sensors being not in operation, its basic polarity is turned on and its normally closed polarity or operation polarity is turned on; and
for each of the opening sensors being in normal operation, its basic polarity is turned on and its operation polarity or normally closed polarity is turned on.

5. The holding brake monitoring circuit system according to claim 4, wherein the working groups are connected in series.

6. A holding brake monitoring circuit system comprising:
a plurality of opening sensors corresponding to holding brakes, wherein the number of the opening sensors is an even number greater than 3, and the opening sensors are configured to be paired to form at least two working groups, and each of the working groups is configured to output an output signal for judging status of corresponding holding brake(s);
wherein each of the opening sensors has a basic polarity, a normally closed polarity, and an operation polarity;
for each of the opening sensors being not in operation, its basic polarity is turned on and its normally closed polarity or operation polarity is turned on; and
for each of the opening sensors being in normal operation, its basic polarity is turned on and its operation polarity or normally closed polarity is turned on;
wherein the basic polarities of the two opening sensors in each of the working group are connected;
when being connected in series, the normally closed polarity of the first opening sensor of the first working group is connected to the high potential, and the operation polarity of the second opening sensor is also connected to the high potential, the normally closed polarity of the second opening sensor is for the next working group to be connected; and
the first part of the output signal is generated based on the operation polarity of the first opening sensor of the first working group.

7. The holding brake monitoring circuit system according to claim 6, wherein, in the serial connection, except for the first working group, the normally closed polarity of the first opening sensor of each of the working groups is connected to the previous working group, and the operation polarity of the second opening sensor is connected to the high potential; and
the second part of the output signal is generated based on the operation polarity of the first opening sensor of each of the working groups.

8. The holding brake monitoring circuit system according to claim 7, wherein, the third part of the output signal is generated based on the normally closed polarity of the second opening sensor of the last working group in the serial connection.

9. The holding brake monitoring circuit system according to claim 7, further comprising a logical AND gate configured to receive the first part and the second part of the output signal and output the fourth part of the output signal.

10. The holding brake monitoring circuit system according to claim 6, further comprising a power supply device configured to provide the high potential.

11. The holding brake monitoring circuit system according to claim 1, wherein the opening sensors are micro switches.

12. The holding brake monitoring circuit system according to claim 1, further comprising a judgment circuit configured to determine status of the holding brakes according to the output signal.

13. An elevator system, comprising the holding brake monitoring circuit system according to claim 1.

14. A holding brake monitoring method, comprising:
pairing a plurality of opening sensors corresponding to holding brakes to form at least two working groups, each of the working groups including a pair of opening sensors, wherein the number of the opening sensors is an even number greater than 3; and
forming an output signal for judging status of the holding brakes according to each of the working groups, each of the working groups configured to output a single output signal for judging status of holding brakes corresponding to a respective working group.

15. The holding brake monitoring method according to claim 14, wherein the step of pairing the opening sensors comprises: if the number of the holding brakes is an odd number, one of the holding brakes is configured to be coupled to two of the opening sensors which are paired into a working group, and each of the remaining holding brakes is configured to be coupled to respective one of the opening sensors.

16. The holding brake monitoring method according to claim 14, wherein the step of pairing the opening sensors comprises: if the number of the holding brakes is an even number, each of the holding brakes is configured to be coupled to respective one of the opening sensors.

17. A holding brake monitoring circuit system comprising:
a plurality of opening sensors corresponding to holding brakes, wherein the number of the opening sensors is an even number greater than 3, and the opening sensors are configured to be paired to form at least two working groups, and each of the working groups is configured to output an output signal for judging status of its corresponding holding brake(s);
wherein a first working group of the at least two working groups includes a first opening sensor of the plurality of opening sensors and a second opening sensor of the plurality of opening sensors, the first opening sensor and the second opening sensor connected in electrical series;
wherein a second working group of the at least two working groups includes a third opening sensor of the plurality of opening sensors and a fourth opening sensor of the plurality of opening sensors, the third opening sensor and the fourth opening sensor connected in electrical series.

* * * * *